United States Patent
Busch et al.

(10) Patent No.: US 7,661,315 B2
(45) Date of Patent: Feb. 16, 2010

(54) METHOD AND APPARATUS FOR ULTRASONIC SCANNING OF A FABRICATION WAFER

(75) Inventors: Ralph E. Busch, Olney, MD (US); Dennis Krausman, Annapolis, MD (US)

(73) Assignee: Sonix, Inc., Springfield, VA (US)

( * ) Notice: Subject to any disclaimer, the term of this patent is extended or adjusted under 35 U.S.C. 154(b) by 594 days.

(21) Appl. No.: 10/852,521

(22) Filed: May 24, 2004

(65) Prior Publication Data
US 2005/0257617 A1 Nov. 24, 2005

(51) Int. Cl.
*G01N 29/04* (2006.01)
(52) U.S. Cl. .............. 73/644; 73/618; 73/622
(58) Field of Classification Search ............ 73/618, 73/644, 633, 861.39, 861.41, 661, 620, 629, 73/627, 600, 41.2, 41.5, 621–624, 642, 582, 73/592, 596, 598; 367/140, 171
See application file for complete search history.

(56) References Cited

U.S. PATENT DOCUMENTS

| | | | |
|---|---|---|---|
| 3,063,290 A | 11/1962 | Kaserman et al. | |
| 3,284,795 A * | 11/1966 | Kenneth et al. | 341/15 |
| 3,489,608 A | 1/1970 | Jacobs et al. | |
| 3,558,093 A | 1/1971 | Bok | |
| 3,617,045 A | 11/1971 | DaCosta et al. | |
| 3,678,735 A | 7/1972 | Boulanger et al | |
| 3,737,573 A | 6/1973 | Kessler | |
| 3,760,822 A | 9/1973 | Evans | |
| 3,765,431 A | 10/1973 | Jannett et al. | |
| 3,790,281 A | 2/1974 | Kessler et al. | |
| 3,850,027 A | 11/1974 | Nakanishi et al. | |
| 3,886,793 A | 6/1975 | Cramer et al. | |
| 3,898,839 A | 8/1975 | White | |
| 3,988,196 A | 10/1976 | Wanesky | |
| 4,008,602 A | 2/1977 | Love | |
| 4,012,951 A | 3/1977 | Kessler | |
| 4,058,000 A | 11/1977 | Ries et al. | |
| 4,093,378 A * | 6/1978 | Horr et al. | 355/76 |
| 4,164,150 A | 8/1979 | Ries et al. | |
| 4,208,915 A | 6/1980 | Edwards | |
| 4,238,962 A | 12/1980 | Taenzer | |
| 4,252,125 A | 2/1981 | Iinuma | |
| 4,316,271 A | 2/1982 | Evert | |
| 4,332,016 A | 5/1982 | Berntsen | |
| 4,344,488 A | 8/1982 | Potts | |
| 4,472,975 A | 9/1984 | Beck et al. | |
| 4,517,985 A | 5/1985 | Teslawski et al. | |
| 4,518,992 A | 5/1985 | Kessler et al. | |
| 4,526,038 A | 7/1985 | Box et al. | |
| 4,543,130 A | 9/1985 | Shwartzman | |
| 4,662,215 A | 5/1987 | Eckert | |
| 4,781,067 A | 11/1988 | Cichanski | |
| 4,807,634 A | 2/1989 | Enjoji et al. | |
| 4,854,337 A | 8/1989 | Bunkenburg et al. | |
| 4,866,986 A | 9/1989 | Cichanski | |

(Continued)

*Primary Examiner*—J M Saint Surin
(74) *Attorney, Agent, or Firm*—Leveque IP Law, P.C.

(57) ABSTRACT

A method and apparatus for ultrasonic scanning of a wafer assembly is disclosed. The wafer assembly is held in a wafer chuck and rotated. A transducer generates ultrasound in the wafer assembly and the ultrasound emitted from the wafer assembly is sensed. A controller adjusts the relative positions of the wafer and the transducer and controls the transducer to generate ultrasound at a number of scan points.

54 Claims, 4 Drawing Sheets

U.S. PATENT DOCUMENTS

| | | |
|---|---|---|
| 4,867,168 A | 9/1989 | Stoor et al. |
| 4,920,803 A | 5/1990 | Karaki et al. |
| 4,924,707 A | 5/1990 | Kliesch |
| 4,977,779 A | 12/1990 | Karaki et al. |
| 5,014,711 A | 5/1991 | Nagasaki |
| 5,060,517 A | 10/1991 | Fushimi et al. |
| 5,077,695 A | 12/1991 | Khuri-Yakub et al. |
| 5,117,697 A | 6/1992 | Takishita et al. |
| 5,195,729 A | 3/1993 | Thomas et al. |
| 5,212,987 A | 5/1993 | Dransfeld et al. |
| 5,240,522 A | 8/1993 | Tanaka et al. |
| 5,301,552 A | 4/1994 | Nagura et al. |
| 5,320,225 A | 6/1994 | Kirkpatrick |
| 5,337,611 A | 8/1994 | Fleming et al. |
| 5,359,895 A | 11/1994 | Isenberg et al. |
| 5,374,021 A | 12/1994 | Kleinman |
| 5,374,829 A | 12/1994 | Sakamoto et al. |
| 5,431,054 A | 7/1995 | Reeves et al. |
| 5,469,742 A | 11/1995 | Lee et al. |
| 5,531,119 A | 7/1996 | Meyers |
| 5,585,564 A | 12/1996 | Brunty et al. |
| 5,600,068 A | 2/1997 | Kessler et al. |
| 5,629,865 A | 5/1997 | Roth |
| 5,646,351 A | 7/1997 | Good et al. |
| 5,668,452 A | 9/1997 | Villarreal et al. |
| 5,684,252 A | 11/1997 | Kessler et al. |
| 5,874,319 A | 2/1999 | Dunaway et al. |
| 5,922,961 A | 7/1999 | Hsu et al. |
| 5,948,985 A | 9/1999 | Brautigan et al. |
| 5,996,415 A | 12/1999 | Stanke et al. |
| 6,027,605 A | 2/2000 | Lehmann et al. |
| 6,044,705 A * | 4/2000 | Neukermans et al. ..... 73/504.02 |
| 6,062,084 A * | 5/2000 | Chang et al. .................. 73/601 |
| 6,085,591 A | 7/2000 | Mallard |
| 6,089,095 A | 7/2000 | Yang et al. |
| 6,156,621 A * | 12/2000 | Nance et al. ................. 438/406 |
| 6,227,946 B1 | 5/2001 | Gonzalez-Martin et al. |
| 6,230,896 B1 | 5/2001 | Lambert |
| 6,261,370 B1 | 7/2001 | Otsuki et al. |
| 6,357,136 B1 | 3/2002 | Erickson et al. |
| 6,460,414 B1 | 10/2002 | Erickson et al. |
| 6,513,796 B2 | 2/2003 | Leidy et al. |
| 6,524,351 B2 | 2/2003 | Ohta |
| 6,540,014 B2 | 4/2003 | Getchel et al. |
| 6,554,003 B1 | 4/2003 | Birang et al. |
| 6,603,103 B1 | 8/2003 | Ulrich et al. |
| 6,709,877 B2 | 3/2004 | Tsui et al. |
| 6,710,886 B2 * | 3/2004 | Park et al. .................... 356/614 |
| 6,712,765 B2 | 3/2004 | Glenn |
| 6,743,296 B2 | 6/2004 | Kao |
| 6,880,387 B2 | 4/2005 | Kessler et al. |
| 6,890,302 B2 | 5/2005 | Oravecz et al. |
| 6,895,820 B2 | 5/2005 | Oravecz et al. |
| 6,912,908 B2 * | 7/2005 | Kessler et al. ................. 73/620 |
| 6,921,672 B2 | 7/2005 | Satya et al. |
| 6,925,882 B1 * | 8/2005 | Fleming et al. ............... 73/632 |
| 6,981,417 B1 * | 1/2006 | Oravecz ....................... 73/619 |
| 7,100,449 B2 * | 9/2006 | Busch et al. .................. 73/644 |
| 7,181,969 B2 * | 2/2007 | Busch et al. .................. 73/618 |
| 2005/0286044 A1* | 12/2005 | Huibers .................... 356/237.1 |
| 2007/0012115 A1* | 1/2007 | Busch et al. .................. 73/644 |

* cited by examiner

METHOD AND APPARATUS FOR ULTRASONIC SCANNING OF A FABRICATION WAFER

FIELD OF THE INVENTION

This invention relates generally to the field of ultrasonic scanning. More particularly, this invention relates to a method an apparatus for scanning fabrication wafers.

BACKGROUND

Ultrasound has been used for non-destructive inspection of parts for many years. In the ultrasonic scanning of shafts or tubes, the part is rotated about its axis of symmetry while an ultrasonic transducer is moved parallel to the axis (i.e. along the shaft or tube) to complete a scan and detect flaws in the part.

More recently, ultrasonic inspection has been extended to small parts such as integrated circuits or other electronic components. Positioning and scanning of individual parts is too time-consuming for production line testing. However, the parts are often loosely arranged in trays or carriers to facilitate transfer of the parts through the production process. Scanning of the parts in trays speeds up the inspection process, but requires special apparatus to hold the parts in place while they are immersed in an acoustic coupling fluid or subjected to a flow of coupling fluid. Additional apparatus is required to dry the parts after they have been scanned. The scan itself is usual performed by moving the tray of parts in a series of steps in one direction while an ultrasonic transducer is moved in a perpendicular direction. In this way a raster scan of each part is performed on a rectangular grid. The process of stopping the transducer at the end of each scan and reversing its motion consumes a significant proportion of the scanning time.

An alternative to scanning individual devices is to scan a complete wafer. In this approach, a wafer is held stationary in a wafer chuck and an ultrasound transducer is moved in a rectangular grid scan pattern across the surface of the wafer.

Wafers may be rotated or spun during various stages of fabrication. Example processes utilizing wafer rotation include spinning coating, spin-drying and thickness measurement. Devices for holding and spinning wafers are commercially available.

SUMMARY

The present invention relates generally to a method and apparatus to scanning fabrication wafers. Objects and features of the invention will become apparent to those of ordinary skill in the art upon consideration of the following detailed description of the invention.

In one embodiment, a transducer generates ultrasound in the wafer and the ultrasound emitted from the wafer is sensed. A controller adjusts the relative positions of the wafer and the transducer and controls the transducer to generate ultrasound at a number of scan points.

BRIEF DESCRIPTION OF THE DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several Views of the drawings.

Micro-devices, RF components, integrated circuits, MEMS etc. are typically manufactured as a collection of devices on a thin disc or fabrication wafer. The wafer may be, for example, a Silicon-on-Insulator (SOI) wafer, a ceramic wafer or a glass wafer. Such wafers are commonly used in the manufacture of integrated circuits, micro-devices, RF components, power components, etc. During the manufacturing process, the wafers are supported by a wafer chuck. The wafers are held in place on the chuck by vacuum suction or by an electrostatic force. The chuck allows the wafer to be rotated rapidly for spin-coating material onto the surface of wafer. When the wafer manufacturing process is completed, the individual devices on the wafer are separated. The separated devices are then placed in trays for movement through the rest of the manufacturing and testing process. Currently, ultrasonic testing of devices is performed on individual devices or on devices held in trays, or on stationary wafers.

The present invention relates to ultrasonic inspection of devices while they are still joined in a single wafer and to inspection of an assembly of wafers. In accordance with one aspect of the present invention, the wafers are held in a wafer holder, such as a wafer chuck, and rotated while one or more ultrasonic transducers are moved in a substantially radial direction parallel to the surface of the wafer using a transducer manipulator, such as a linear motor or robot arm. In one embodiment, a fluid supply injects coupling liquid is injected into the space between the face of the ultrasonic transducer and the surface of the wafer to provide acoustic coupling between the transducer and the wafer. The rotational motion of the wafer causes the coupling liquid to be spun from the wafer, and aids in the drying of the wafer after the inspection process. In a further embodiment, ultrasound is generated by impacting a pulsed laser beam on the surface of the wafer so as to cause rapid heating of a thin surface layer. In this embodiment, the reflected ultrasound may be detected by a laser interferometer for example.

In a further embodiment, the transducer is held stationary, while the wafer is both rotated and translated. A positioning device, such as a robot arm, may be used to adjust the relative positions of the wafer and the transducer by moving the wafer, the transducer or both the wafer and the transducer.

In the sequel, the invention is described with reference to a single wafer. However, it is to be understood that the invention also relates to the scanning of assemblies of wafers or the scanning of other object. For example, in the manufacture of micro-electromechanical devices (MEM's), two or more wafers may be bonded together. The wafers may be scanned or the bond between the wafers may be scanned. Similarly, a wafer assembly is taken to include both a single wafer and an assembly of two or more wafers.

Figure 1:
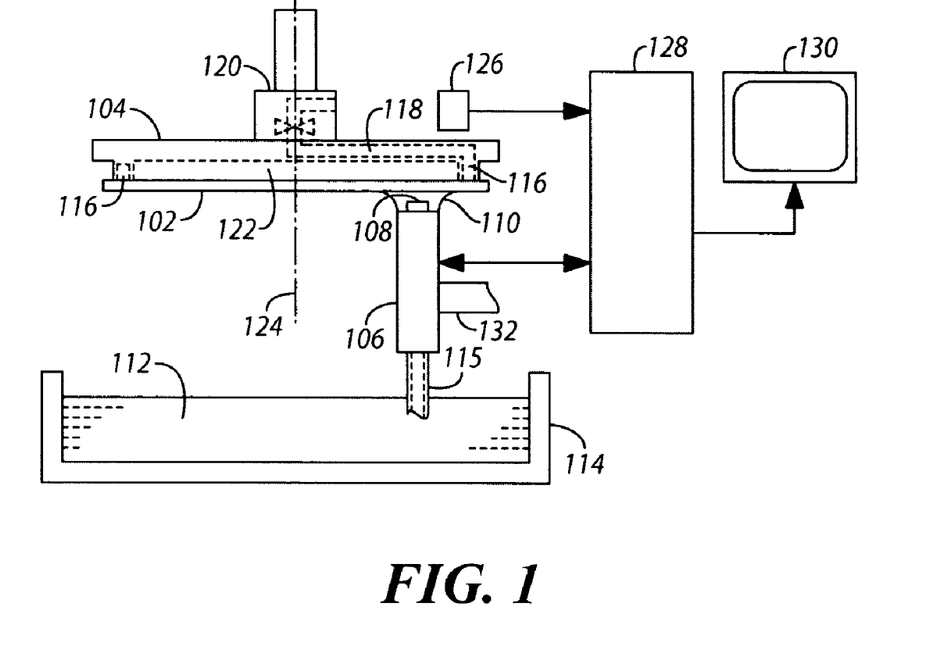
FIG. 1 is a diagrammatic representation of a scanning system in accordance with certain embodiments of the present.

FIG. 1 is a side view of an exemplary ultrasonic scanning system of the present invention. Referring to FIG. 1, a microdevice wafer 102 held by a wafer holder or wafer chuck 104. The wafer may be moved between the wafer holder and one or more storage units by a wafer manipulator, such as a robot arm. An ultrasonic transducer 106 is positioned close to the surface of the wafer such that an ultrasonic beam emitted from the face 108 of the transducer impinges upon the wafer. Reflections of the ultrasonic beam are sensed by the transducer 106. The properties of the reflected ultrasound wafer relate to the acoustic wave speed within the wafer and may be used to identify the structure of the wafer. Typically, wafers diameters are in the range 30 mm to 300 mm or larger. In the embodiment shown in FIG. 1, acoustic coupling of the ultrasonic beam to the wafer is enhanced by a column of water or other fluid 110 that is maintained by flowing fluid from one or more positions in close proximity to the transducer. The wafer may be oriented in any direction. However, the wetting of the wafer by the coupling liquid is minimized when the axis of rotation in substantially vertical, with the surface of the wafer facing downwards and the transducer positioned below the wafer, as depicted in FIG. 1. Coupling liquid 112 may be collected in a reservoir 114 positioned below the transducer and re-circulated using a pump (not shown) coupled to tube 115. The periphery of the wafer 102 is held in contact with the wafer chuck 104 by use of vacuum suction maintained in channel 116. The channel is coupled via passage 118 to a vacuum pump 120 that is used to draw air out of the channel 116 and maintain the vacuum. Alternatively, a mechanical holder or electrostatic charge may be used to hold the wafer 102 to the chuck 104. The chuck may be recessed to provide a cavity 122 behind the wafer 102 or may be configured to support more of the wafer so as to prevent flexing. In operation, the wafer chuck is rotated about an axis 124 perpendicular to its surface. The axis may correspond to the axis of symmetry of the wafer. A rotational position or shaft encoder 126 is used to indicate the rotational position of the wafer or, equivalently, the rotational position of the wafer chuck. The rotational position encoder 126 may, for example, be an optical, magnetic or mechanical encoder that senses the angular position of the shaft of the wafer holder or the wafer. In one embodiment the resolution of the rotational position encoder is sufficient to maintain the desired linear resolution at the periphery of the wafer. For example, if a 1.51 µm linear resolution is required at a radius of 0.15 m, the angular resolution should be approximately $1.5 \times 10^{-6}/0.15 = 10^{-5}$ radians. Such encoders are commercially available. In one embodiment of the invention, a computer 128 triggers the transducer 106 to produce an ultrasound pulse and simultaneously records the signal from the position encoder 126. In a further embodiment, the chuck is rotated at a constant speed and a phase locked loop circuit is used to determine the times at which the ultrasound is generated. In a still further embodiment, the computer 128 monitors the signal from the rotational position encoder 126 and triggers the transducer to produce an ultrasound pulse when wafer 102 is at a predetermined rotational position. For example, if a constant spacing of d is required between scanned points on a circular scan, the angular spacing at radius r should be $$\theta = 2\arcsin\left(\frac{d}{2r_n}\right),$$

where, for example, the radius of the scan is $r_n = (2n-1)d/2$, n=1, 2, 3, .... In this example the circumferential distance between scanned points is held constant, but the angular spacing between points varies with the radius. Alternatively, the angular spacing can be held constant to obtain points on a polar grid. Other grid patterns will be apparent to those of ordinary skill in the art. The resulting scan is displayed on visual display unit 130.

When a linear (raster) scan of a wafer or an individual device is made, a significant proportion of the scan time elapses while the transducer stops at the end of each scan line and reverses direction. In the present invention the, wafer can be rotated continuously. This is possible provided that the distance moved by a scan point within each scanning pulse is small. The duration of the ultrasonic pulse is very small (typically a few nanoseconds), so the time scale is dependent upon the propagation time of the pulse from the transducer to the wafer and back. For example, if the transducer has a focal length of 5 mm and the speed of sound in the coupling liquid is 1481 m/s, the propagation time is 0.01/1481=6.75 µs (note, however, that the sound speed is usually higher in the wafer material, so this is the maximum propagation time). This time is related to the minimum time between ultrasound pulses. If the region of the wafer to be scanned is moving at 1.48 m/s, the distance between pulses will be approximately 10 µm. For a 300 mm diameter wafer rotating at k revolutions per second, the speed at the periphery is $0.3*\pi*k$. So a speed of 1.48 m/s at the periphery corresponds to approximately 1.57 revolutions per seconds. However, the wafer can be rotated n times faster if only every $n^{th}$ point is measured on each rotation. Faster rotation may be beneficial for removing coupling liquid from the surface of the wafer. Additionally, the wafer may be spun at a much faster rate after the scan is completed. Starting the scan from the center of the wafer may provide the best removal of coupling liquid from the surface. The position of the transducer 106 is controlled by a linear positioning stage or robot arm 132. Such devices are commercially available, and devices designed for wafer handling may be readily converter for transducer handling. The positioning stage or robot arm 132 is controlled by the computer 128. Additionally, the distance between the transducer and the wafer may be adjusted to alter the focus of the ultrasonic beam. The computer 128 may also include a visual display unit 130 for displaying images of the scanned wafer. It is to be understood that linear motions, such as that for radial motion or focusing, may be performed by moving the wafer, the transducer or both.

Figure 2:
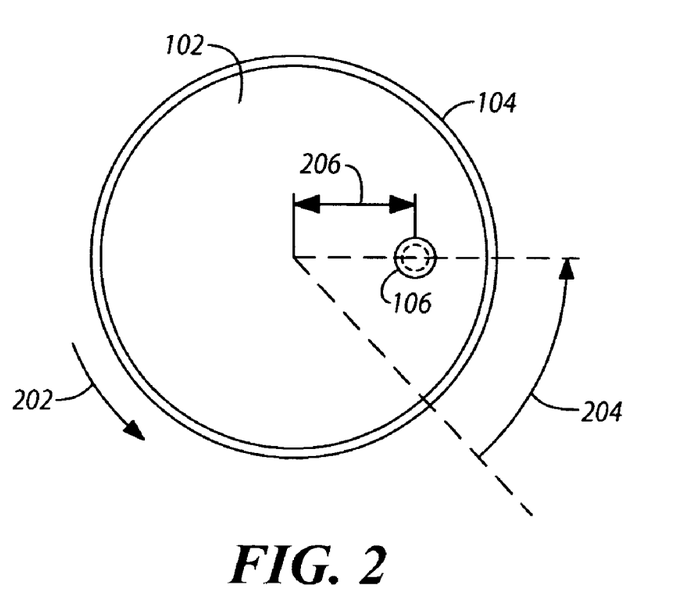
FIG. 2 is a further diagrammatic representation of a scanning system in accordance with certain embodiments of the present.

FIG. 2 shows a diagrammatic view of the scanning system from below. During operation, the wafer 102 is held by wafer chuck 104 and is rotated as indicated by the arrow 202. The angular position of the chuck is indicated by the angle 204 from a reference line 206. In one embodiment of the invention, the transducer 106 is moved parallel to the wafer 102 in a radial direction, as indicated by the arrow 208.

The duration of the ultrasonic pulse is short enough that the wafer moves only a small distance within the duration of the pulse. Hence, the wafer can be kept in constant rotation and it is not necessary to stop the wafer to perform a scan measurement. This reduces the time taken for a scan.

A position at a radial distance r from the center of the wafer and at a rotational angle θ has polar coordinates {r, θ}, relative to the center of the wafer, which correspond to rectangular coordinates {r .cos(θ), r .sin(θ)}. Similarly, the rectangular coordinates {x, y} correspond to polar coordinates {$\sqrt{x^2+y^2}$, arctan(y, x)}.

In one embodiment of the invention, the polar coordinates {r, θ} at which a measurement is made are chosen to yield a predetermined position in a rectangular grid.

In a further embodiment, the measurements are made on a polar grid and interpolated to a rectangular grid for display. The polar grid corresponds to points in a number of concentric circles. The measurements made on the polar grid may be interpolated to a rectangular grid for display.

In a still further embodiment, the measurements are made on a spiral grid and interpolated to a rectangular grid for display.

The rotation speed of the wafer may be held constant for the duration of the scan or it may be varied. For example, rotation the speed may be varied to maintain constant speed past the face of the transducer at different radial positions.

The radial motion of the wafer relative to the transducer may be achieved by motion of the wafer, by motion of the transducer or a combination thereof. The motion may be generated by a linear servo-motor, for example.

In one embodiment of the invention, the scan is performed on a set of concentric circles, starting at the innermost circle and extending outwards. The following code, in the MATLAB® programming language of The Mathworks, generates scan points on a set of concentric circles and guarantees that neighboring points are separated by a distance no greater than d.

```
d = 1e-5;                              % maximum separation of scan points
maxRadius = 0.15;                      % maximum radius for scan
% set innermost scan circle
N = 3;                                 % no. of points on innermost circle
theta(1) = 2*pi/N;                     % angle between adjacent scan points
r(1) = d/(2*sin(theta(1)/2));          % radius of circle that gives ...
                                       % ... exactly this number of points
rMax = r(1);
count = 0;
n = 0;
while rMax <= maxRadius
    n = n+1;                           % circle number
    % calculate rectangular coordinates
    for k=1:N
        count = count+1;
        x(count) = r(n)*cos((k-1)*theta(n));   % x-coord. of scan point
        y(count) = r(n)*sin((k-1)*theta(n));   % y-coord. of scan point
    end
    % estimate radius of next circle (using worst case scenario)
    r(n+1) = r(n)*cos(theta(n)/2) + sqrt(3)*(d/2);
    % get angle increment if new points separated by d
    theta(n+1) = 2*asin(d/2/r(n+1));
    % reduce radius to get whole number of points on circle
    N = fix(2*pi/theta(n+1));          % whole number of points
    theta(n+1) = 2*pi/N;               % corresponding angle increment
    r(n+1) = d/(2*sin(theta(n+1)/2));  % radius of circle that has
                                       % exactly this number of points
    rMax = r(n+1);                     % new maximum radius
end
```

The scan described above requires about 0.89 billion scan points.

Figure 3:
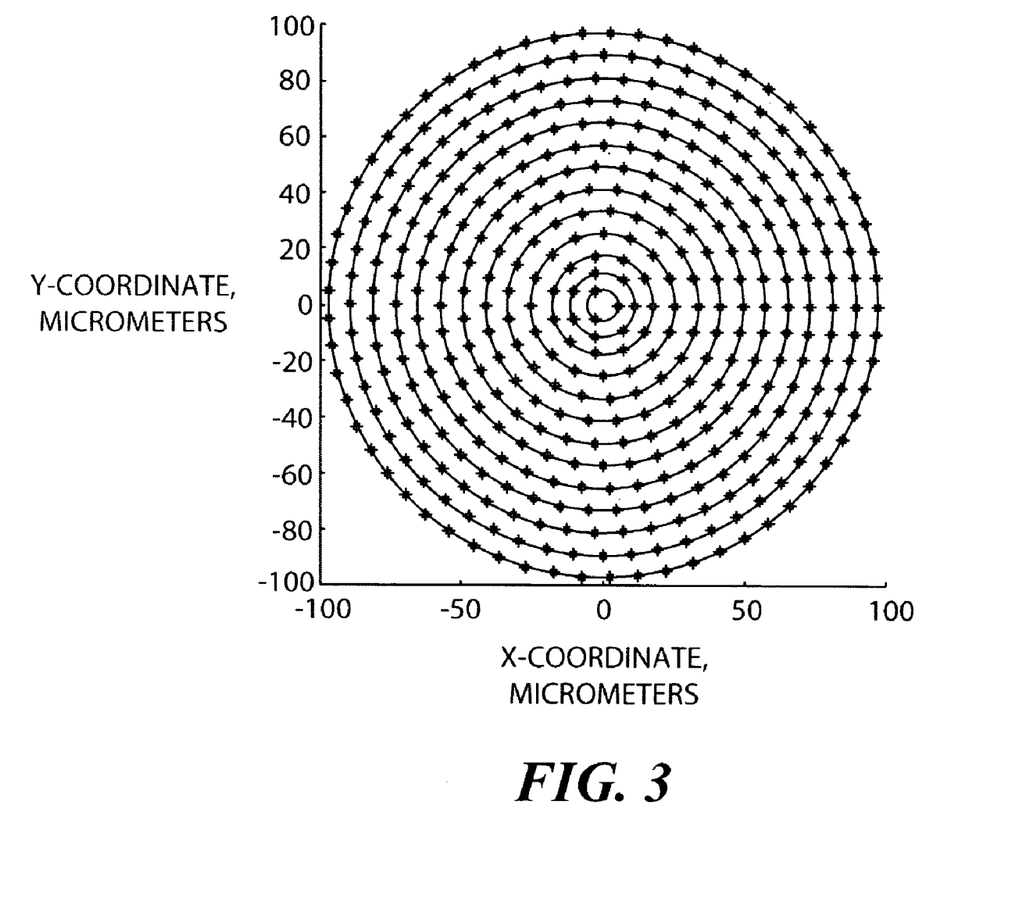
FIG. 3 is a plot of part of an exemplary grid of scan points.

FIG. 3 shows the first few circular scans, with the dimensions in micrometers. The scan may be executed as a series of circular scans. The transducer is held in a fixed position as each circular scan is made. In a revolution of the wafer, one or more scan points are measured.

The rectangular scan coordinates {x, y} may be used to interpolate to a rectangular grid using interpolation techniques known to those of ordinary skill in the art.

Multiple transducers may be used. Each transducer may act as both a transmitter and receiver of ultrasound, or one transducer may generate ultrasound while another senses the ultrasound reflected by the wafer. The latter approach allows for oblique incidence of the ultrasonic beam upon the wafer.

Figure 4:
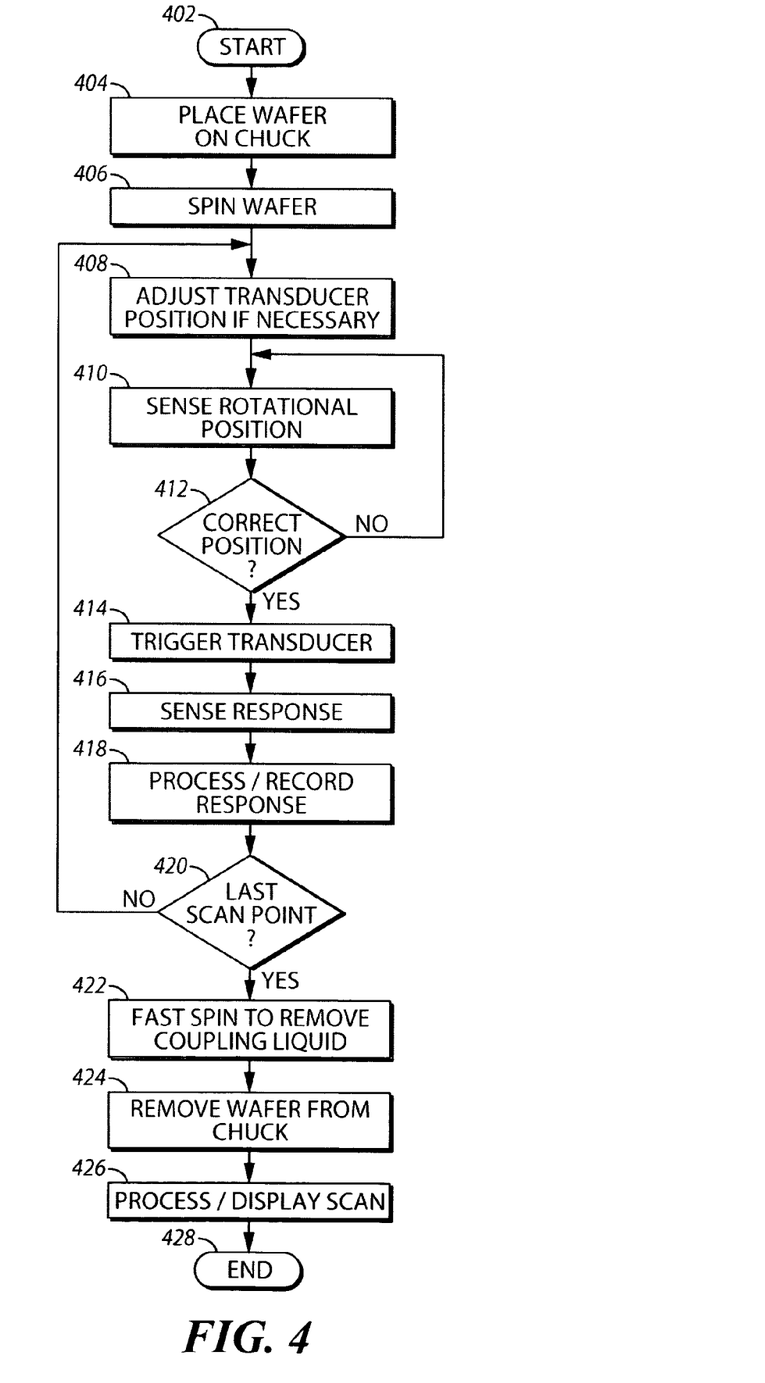
FIG. 4 is a flow chart depicting certain embodiments of the method of the present invention.

FIG. 4 is a flow chart depicting one embodiment of the method of the invention. Following start block 402, the wafer to be scanned is placed on the wafer chuck at block 404. The wafer is then spun at block 406. The spinning of the wafer allows a variety of scan patterns to be followed and aids in the removal of coupling fluid from the surface of the wafer. At block 408, the transducer is moved, if necessary, to the position of the next scan. This may involve radial motion of the transducer to a new scan circle or movement perpendicular to the surface of wafer to adjust the focus of the transducer. At block 410 the computer controller senses the rotational position of the wafer (or, equivalently, the wafer chuck). At decision block 412, the position is checked to determine if a measurement is to be made at this position. If not, as depicted by the negative branch from decision block 412, flow returns to block 410 until the next rotational position is reached. If a measurement is to be made at the current position, flow continues to block 414 as depicted by the positive branch from decision block 412. The transducer is triggered to emit a pulse of ultrasound at block 414 and the resulting ultrasound reflected from the wafer is sensed at block 416. The same transducer may be used to generate and sense the ultrasound, or different transducers may be used. At block 418, the sensed ultrasound is processed and/or recorded. If interpolation from the measurement grid to a display grid is required, the computation may proceed in parallel to the measurement process so as to reduce time at the end of the scan and possibly to reduce memory requirements for the computer. At block 420 a check is made to determine if all of the measurements have been completed. If not, as depicted by the negative branch from decision block 420, flow returns to block 408. If the scan has been completed, as depicted by the positive branch from decision block 420, the rotation rate of the wafer may be increased at block 422, if necessary, to removed coupling liquid from the surface of the wafer. The wafer is than removed from wafer at block 424. At block 426, any additional processing is performed and the resulting scan is displayed and recorded. The scan of the wafer is then complete, as indicated by termination block 428.

Figure 5:
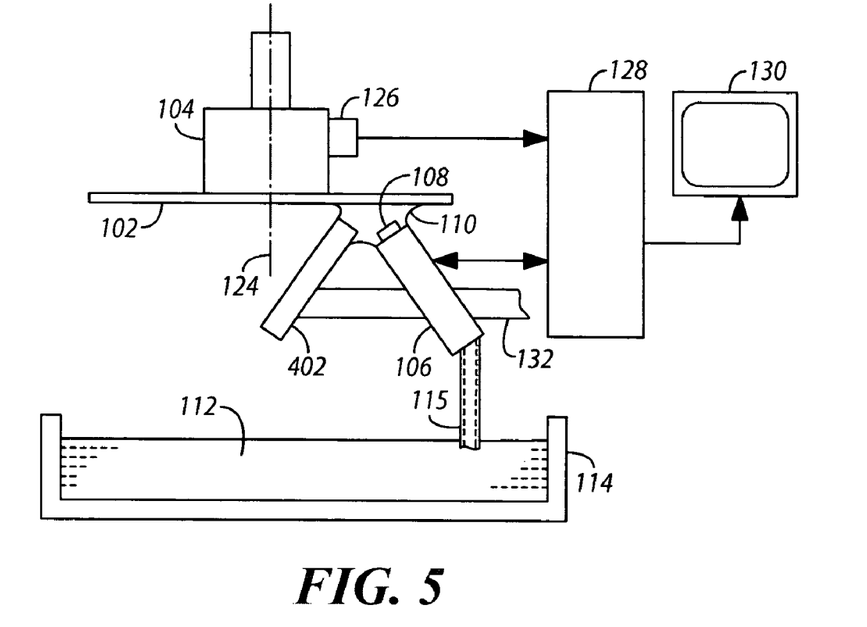
FIG. 5 is a diagrammatic representation of a scanning system in accordance with a certain embodiment of the present invention.

In an alternative embodiment of the invention, shown in FIG. 5, ultrasound is generated by a transducer 106 at an angle to the surface of the wafer. The resulting reflected ultrasound is detected by a second transducer 402. The angles of the transducers 106 and 402 may be adjusted to alter the angle at which the ultrasound is incident upon the wafer. Additionally, the transducers may be moved together in a radial direction to complete the desired scan pattern.

Figure 6:
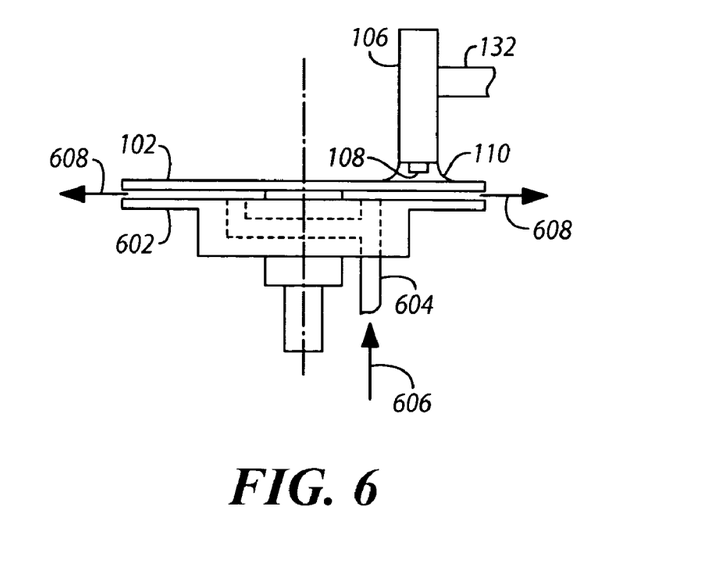
FIG. 6 is a diagrammatic representation of a scanning system in accordance with an embodiment of the invention.

In the embodiment shown in FIG. 6, the wafer 102 is held from below and the upper surface of the wafer is scanned from above using transducer 106. The coupling fluid 110 may have an undesirable tendency to flow over the edge of the wafer and onto the underside of the wafer. This may be prevented by directing a flow of gas across the underside of the wafer. The flow of gas has a component that is directed radially outwards at the edge of the wafer. This flow prevents coupling fluid from wetting the underside of the wafer. The flow may be provided by a variety of means including one or more gas jets, such as air-knives. In FIG. 6, a lower channel surface 602 is provided beneath the wafer 102. The lower channel surface and the underside of the wafer provide a gas channel. Air, or other gas, enters tube 604 in the direction of arrow 606 and flows into the channel. Air flows out of the channel in a substantially radial direction, as indicated by the arrows 608. The lower channel 602 may be stationary or may rotate with the wafer chuck.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for ultrasonic scanning of a wafer assembly, comprising:
   rotating the wafer assembly about a rotational axis substantially perpendicular to the surface of the wafer assembly;
   for each scan point of a plurality of scan points:
      generating an ultrasound pulse in a region of the wafer assembly using a transducer positioned at the scan point in proximity to the region of the wafer assembly; and
      sensing ultrasound emitted from the wafer assembly,
   determining properties of the wafer assembly from the ultrasound emitted from the region of the wafer assembly on a non-rectangular coordinate grid; and
   estimating properties of the wafer assembly on a rectangular coordinate grid by interpolating from the properties measured on the non-rectangular coordinate grid.

2. A method in accordance with claim 1, further comprising moving the transducer in a direction substantially parallel to the surface of the wafer assembly from a first scan point to a second scan point.

3. A method in accordance with claim 2, wherein the transducer is moved in a direction substantially radial relative to the rotational axis of the wafer assembly.

4. A method in accordance with claim 1, further comprising moving the wafer assembly in a radial direction relative to the rotational axis of the wafer assembly, to move the scan point from a first location to a second location.

5. A method in accordance with in claim 1, further comprising, at each scan point, determining the location of the region of the wafer assembly from the position of transducer and the rotational position of the wafer assembly.

6. A method in accordance with claim 5, wherein the rotational position of the wafer assembly is sensed by a position encoder.

7. A method in accordance with claim 5, wherein the rotational position of the wafer assembly is determined by a phase locked loop.

8. A method in accordance with claim 1, wherein the plurality of scan points are positioned on a plurality of concentric circles.

9. A method in accordance with claim 8, wherein the plurality of scan points are positioned such the maximum separation between neighboring scan points is less than a predetermined distance.

10. A method in accordance with claim 8, wherein the plurality of scan points are positioned at substantially equal circumferential separations.

11. A method in accordance with claim 1, wherein the plurality of scan points are positioned on one of a polar grid and a spiral grid.

12. A method in accordance with claim 1, wherein the wafer assembly is rotated as a substantially constant speed.

13. A method in accordance with claim 1, wherein the rotational rate of the wafer assembly is varied dependent upon the radial position of the transducer.

14. A method in accordance with claim 1, wherein the transducer is an ultrasonic transducer, further comprising maintaining a flow of coupling fluid between the transducer and the surface of the wafer assembly to enhance acoustic coupling between the transducer and the wafer assembly.

15. A method in accordance with claim 14, wherein the rotational rate of the wafer assembly is sufficient to remove coupling fluid from the surface of the wafer assembly from the surface of the wafer assembly.

16. A method in accordance with claim 14, further comprising rotating the wafer assembly at an increased speed after the scan is completed so as to remove coupling liquid.

17. A method in accordance with claim 15, wherein the surface of the wafer assembly faces downwards and the transducer is positioned below the wafer assembly.

18. A method in accordance with claim 17, further comprising collecting coupling fluid in a reservoir and re-circulating the coupling fluid to maintain flow between the transducer and the surface of the wafer assembly.

19. A method in accordance with claim 15, wherein the surface of the wafer assembly faces upwards and the transducer is positioned above the wafer assembly and further comprising directing a flow of gas to the underside of the wafer assembly to keep the underside of the wafer assembly free from coupling fluid.

20. A method in accordance with claim 1, further comprising:
   positioning the wafer assembly on a wafer chuck using a robot arm;
   holding the wafer assembly in place on the wafer chuck; and
   rotating the wafer chuck to rotate the wafer assembly.

21. A method in accordance with claim 1, further comprising moving the transducer using a robot arm.

22. A method in accordance with claim 1, further comprising moving the transducer using a linear positioning stage.

23. A method in accordance with claim 1, further comprising:
   determining properties of the wafer assembly from ultrasound emitted from the wafer assembly; and
   displaying the properties on a visual display unit.

24. A method in accordance with claim 1, wherein the ultrasound pulse is generated by local heating of the surface of the wafer assembly.

25. A method in accordance with claim 1, wherein the emitted ultrasound is sensed by measuring motion of a surface of the wafer assembly.

26. An ultrasonic scanner for scanning a wafer assembly, the ultrasonic scanner comprising:
   a wafer chuck for holding and rotating the wafer assembly about a rotational axis substantially perpendicular to the surface of the wafer assembly;
   a first transducer operable to generate an ultrasound pulse at the surface of the wafer assembly;
   a second transducer operable to sense ultrasound emitted from the surface of the wafer assembly;
   a rotational encoder operable to determine the rotational position of at least one of the wafer assembly and the wafer chuck;
   a controller, responsive to the rotational encoder, that adjusts the relative positions of the wafer assembly and the first and second transducers and for controlling the generation of the ultrasound pulse, and a processing unit for determining properties of the wafer assembly from the ultrasound emitted from the wafer assembly;

wherein the properties of the wafer assembly are measured on a non-rectangular grid and wherein the processing unit is operable to estimate properties of the wafer assembly on a rectangular grid by interpolating from the properties are measured on the non-rectangular grid.

27. An ultrasonic scanner in accordance with claim 26, wherein the rotational encoder comprises a position encoder.

28. An ultrasonic scanner in accordance with claim 26, wherein the rotational encoder comprises a phase locked loop.

29. An ultrasonic scanner in accordance with claim 26, further comprising a transducer manipulator operable to move the first and second transducers in a substantially radial direction relative to the rotational axis of the wafer assembly.

30. An ultrasonic scanner in accordance with claim 26, further comprising a transducer manipulator operable to move the first transducer in a direction substantially parallel to the rotational axis of the wafer assembly to adjust focus of the first transducer.

31. An ultrasonic scanner in accordance with claim 26, further comprising a wafer manipulator operable to position the wafer assembly on the wafer chuck and remove the wafer assembly from the wafer chuck.

32. An ultrasonic scanner in accordance with claim 26, wherein the wafer chuck is one of a mechanical chuck, a vacuum chuck and an electrostatic chuck.

33. An ultrasonic scanner in accordance with claim 26, further comprising a fluid supply that provides a flow of acoustic coupling fluid between the first transducer and surface of the wafer assembly.

34. An ultrasonic scanner in accordance with claim 33, wherein the fluid supply comprises:
a reservoir positioned below the first transducer for collecting acoustic coupling fluid; and
a pump operable to pump acoustic coupling fluid from the reservoir to maintain the flow of acoustic coupling fluid between the first transducer and surface of the wafer assembly.

35. An ultrasonic scanner in accordance with claim 33, wherein the surface of the wafer assembly faces substantially downwards and the first transducer is positioned below the surface of the wafer assembly.

36. An ultrasonic scanner in accordance with claim 33, wherein the wafer assembly is rotated at a speed sufficient to remove acoustic coupling liquid from the surface of the wafer assembly.

37. An ultrasonic scanner in accordance with claim 26, further comprising a positioning device operable to adjust the position of the wafer chuck relative to the first transducer.

38. An ultrasonic scanner in accordance with claim 26, further comprising a processing unit for determining properties of the wafer assembly from the ultrasound emitted from the wafer assembly.

39. An ultrasonic scanner in accordance with claim 38, further comprising a visual display unit, coupled to the processing unit, for displaying the properties of the wafer assembly determined from the ultrasound emitted from the wafer assembly.

40. An ultrasonic scanner in accordance with claim 38, wherein the properties of the wafer assembly are measured on a non-rectangular grid and wherein the processing unit is operable to estimate properties of the wafer assembly on a rectangular grid by interpolating from the properties are measured on the non-rectangular grid.

41. An ultrasonic scanner in accordance with claim 26, wherein the first and second transducers comprise a single ultrasonic transducer operable to generate an ultrasound beam that impinges on the surface of the wafer assembly.

42. An ultrasonic scanner in accordance with claim 26, wherein the first transducer comprises an ultrasonic transducer on one side of the wafer assembly and the second transducer comprises an ultrasonic transducer on the opposite side of the wafer assembly.

43. An ultrasonic scanner in accordance with claim 26, wherein the first transducer comprises a laser operable to cause the ultrasound pulse by heating the surface of the wafer assembly.

44. An ultrasonic scanner in accordance with claim 26, wherein the second transducer comprises a laser interferometer operable to detect motion of the surface of the wafer assembly.

45. An ultrasonic scanner for scanning of micro-device wafer assembly, the ultrasonic scanner comprising:
a wafer chuck operable to hold and rotate the wafer assembly about a rotational axis substantially perpendicular to the surface of the wafer assembly;
a first ultrasonic transducer operable to emit an ultrasound beam that impinges upon the surface of the wafer assembly;
a second ultrasonic transducer operable to sense ultrasound reflected from the wafer assembly;
a rotational encoder operable to determine the rotational position of at least one of the wafer assembly and the wafer chuck; and
a controller, responsive to the rotational encoder that adjusts the relative positions of the wafer assembly and the first and second ultrasonic transducers and controls the emission of the ultrasound beam,
wherein the wafer assembly comprises two or more wafers bonded together by one or more bond layers that are scanned to detect the occurrence of internal wafer assembly defects.

46. An ultrasonic scanner in accordance with claim 45, further comprising a means for moving the first and second transducers in a radial direction relative to the rotational axis of the wafer assembly.

47. An ultrasonic scanner in accordance with claim 45, further comprising a fluid supply that maintains a flow of acoustic coupling fluid between the first and second transducers and a surface of the wafer assembly.

48. An ultrasonic scanner in accordance with claim 47, wherein the wafer assembly is rotated at a speed sufficient to remove acoustic coupling liquid from the surface of the wafer assembly.

49. An ultrasonic scanner in accordance with claim 47, wherein the surface of the wafer assembly faces substantially downwards and the ultrasonic transducer is positioned below the surface of the wafer assembly.

50. An ultrasonic scanner in accordance with claim 45, further comprising a means for adjusting the angle of the first transducer and thereby adjust the angle at which the ultrasonic beam impinges upon the surface of the wafer assembly.

51. An ultrasonic scanner in accordance with claim 45, further comprising a means for adjusting the angle of the second transducer and thereby adjusting the angle at which the reflected ultrasound is received by the second transducer.

52. An ultrasonic scanner for scanning a wafer assembly, the ultrasonic scanner comprising:
a wafer holder operable to hold and rotate the wafer assembly about a rotational axis substantially perpendicular to the surface of the wafer assembly;

a transducer for generating ultrasound in the wafer assembly;

a sensor responsive to the ultrasound emitted by the wafer assembly; and a position adjuster operable to adjust the relative positions of the transducer and the wafer assembly such that the ultrasound is moved in a scan path across the surface of the wafer assembly, wherein the wafer assembly comprises two or more wafers bonded together by one or more bond layers that are scanned to detect the occurrence of internal wafer assembly defects.

53. An ultrasonic scanner in accordance with claim 52, further comprising:

an automated wafer manipulator operable to position the wafer assembly on the wafer holder and to remove the wafer assembly from the wafer holder.

54. An ultrasonic scanner in accordance with claim 52, further comprising:

a coupling fluid supply operable to provide an acoustic coupling between the transducer and the surface of the wafer assembly; and a dryer operable to remove coupling fluid from the wafer assembly after the wafer assembly has been scanned.

\* \* \* \* \*

UNITED STATES PATENT AND TRADEMARK OFFICE
CERTIFICATE OF CORRECTION

PATENT NO. : 7,661,315 B2
APPLICATION NO. : 10/852521
DATED : February 16, 2010
INVENTOR(S) : Busch et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1046 days.

Signed and Sealed this

Thirtieth Day of November, 2010

David J. Kappos
*Director of the United States Patent and Trademark Office*